United States Patent [19]

Randle

[11] Patent Number: 4,892,377

[45] Date of Patent: Jan. 9, 1990

[54] ALIGNMENT OF FIBRE ARRAYS

[75] Inventor: Frederick A. Randle, Northants, England

[73] Assignee: Plessey Overseas Limited, Ilford, England

[21] Appl. No.: 233,757

[22] Filed: Aug. 19, 1988

[30] Foreign Application Priority Data

Aug. 19, 1987 [GB] United Kingdom ............... 8719557

[51] Int. Cl.$^4$ .............................................. G02B 6/42
[52] U.S. Cl. .................................. 350/96.2; 350/96.15; 350/320
[58] Field of Search ................. 350/96.2, 96.21, 96.22, 350/320

[56] References Cited

U.S. PATENT DOCUMENTS

| 3,871,014 | 3/1975 | King et al. | 357/67 |
| 3,871,015 | 3/1975 | Lin et al. | 357/67 |
| 3,963,920 | 6/1976 | Palmer | 250/239 |
| 4,763,979 | 8/1988 | Heywang | 350/96.2 |
| 4,768,199 | 8/1988 | Heinen et al. | 350/96.2 X |

Primary Examiner—John D. Lee
Assistant Examiner—John Ngo
Attorney, Agent, or Firm—Fleit, Jacobson, Cohn, Price, Holman & Stern

[57] ABSTRACT

In order accurately to align an array of optical fibres (10) with optical components such as waveguides (14) in a block of insulative material (12) on a substrate (2) both in the plane of the substrate and in a height dimension normal to the substrate, the fibres are fixed in accurately formed V-grooves (8), and the block (12) has an array of accurately formed solder pads (16) in one to one correspondence with an array of solder pads (4) on the surface of the substrate (2) the array of solder pads (4, 16) being secured to one another by solder drops (6) containing controlled amounts of solder and thus being precisely dimensioned. The fibres (10) may be secured in V-grooves (8) with solder. Some of the solder pads (4) may be formed as conductive tracks electrically interconnecting with electrical components formed in block (12) and integrated circuits formed in substrate (2).

9 Claims, 6 Drawing Sheets

ALIGNMENT OF FIBRE ARRAYS

This invention relates to the alignment of an array of one or more optical elements, principally optical fibres, with an array of one or more optical components arranged in one or more blocks or material.

For the purpose of this specification, 'optical component' is intended to means any light transmission component such as a laser diode, any light receiving component such as a photodiode, or any light or light waveguide conducting component, such as a conductive strip, arranged in a block of material, usually a plastics insulative material.

For the purpose of this specification, 'optical element' is intended to mean a light conducting element such as optical fibre although it also includes a light waveguide and any of the devices encompassed in the term optical component as above defined.

A problem which has existed in the past is that of alignment of an array of separate optical fibers with respective optical components in order that an efficient light coupling be achieved between the ends of the fibres and the optical components. One prior method involved locating the optical fibres at predetermined locations on a substrate of silicon and then positioning the block or blocks containing the optical components in alignment with the fibres by a manual positioning procedure while at the same time bonding the block or blocks to the substrate by a suitable adhesive. The problem with this method of alignment is that it is time consuming and a complex and highly skilled operation.

To overcome this problem, the present invention adapts a technique which is well known in the art of connecting and aligning an integrated circuit chip on a substrate which is known as controlled collapse reflow chip bonding (CCRCB).

This technique involves aligning the chip in the two dimensional plane of the substrate by aligning an array of solder bumps on a registering array of solder pads on the co-operating faces of the substrate and chip. In the present invention this technique is adapted to the problem of alignment of optical components and optical elements by controlling the height position of the optical components and elements relative to a substrate surface by close control over the size of solder drops employed in the CCRCB technique.

Thus the present invention provides a method of aligning an array of one or more optical elements with an array of one or more optical components arranged in one or more blocks, the method comprising:

a) providing a substrate having formed thereon locating means for receiving said optical elements;

b) forming on the substrate an array of solder pads each of predetermined area surrounded by areas which are solder-repellent;

c) forming on the or each block an array of solder pads each of predetermined area surrounded by areas which are solder repellent, the solder pads on the or each block being in one-to-one correspondence with the solder pads on the substrate;

d) depositing on some or all of the solder pads controlled amounts of solder; and, e) locating the optical elements in the locating means and positioning and securing the or each block on the substrate with the respective arrays of solder pads in registration and the controlled amounts of solder forming solder drops of predetermined dimensions which serve to secure the blocks and align the blocks in the plane of the substrate and in a height dimension normal to the plane of the substrate.

Thus in accordance with the invention it is possible to align the block and blocks containing optical components with optical elements (optical fibres) both in the plane of the substrate and in the height dimension, since the dimensions of the solder drops on the solder pads can be precisely controlled. The dimensions of the solder pads can be very precisely controlled by photolithographic techniques, and the thickness of solder deposited on the pads can be controlled by evaparation techniques involving forming an accurately dimensioned mask by photolithographic techniques. In this way the height of the blocks above the substrate can be predicted within a margin of error of 0.5 $\mu$m or less, which is sufficient for the purpose of optical alignment of optical fibres with optical components.

The substrate may have formed therein electrical components which are electrically connected with the solder pads and hence to electrical components within the block or blocks of optical components.

Embodiments of the invention will now be described with reference to the accompanying drawings, wherein.

Figure 1:
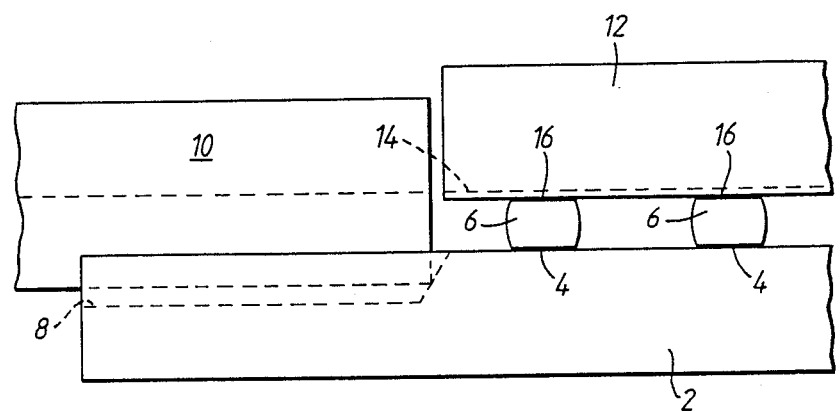
FIG. 1 is a fragmentary cross-sectional view of an optical coupling assembled in accordance with the invention.

Referring to FIG. 1, a slice of silicon 2 forms a substrate and has formed thereon an array of precisely positioned and dimensioned solder pads 4, formed by photolighographic techniques. The solder pads 4 are covered with precisely metered amounts of solder 6 by an evaporation technique involving using an accurate dimensioned mask formed by photolithographic techniques. The silicon surface surrounding the pads is non-wettable or repellent to solder. In addition, an array of V-shaped grooves 8 are formed which extend to one edge of the substrate dimensioned for receiving therein the ends of an array of optical fibres 10. An optical device 12 formed as a block of material includes optical components comprising ports (waveguides) 14. The lower surface of the block includes an array of solder pads 16 formed in the some manner as solder pads 4 and positioned so as to be in one to one correspondence or registration with pads 4.

In order to assemble the optical coupling of FIG. 1, the two arrays of solder pads 4, 16 are brought into coarse alignment and the assembly is raised in temperature until the solder 6 becomes molten. The molten solder will by surface tension effects align the two sets of pads and will form drops of precisely determined dimensions which will establish the height of device 12 above the plane of the substrate to an accuracy of less then 0.5 $\mu$m, which is sufficient to establish an accurate optical coupling between fibres 10 and the optical components. On cooling of the solder, the device 12 is rigidly secured to the substrate.

The fibers 10 may be secured into the V-grooves 8 by solder or other suitable adhesive before or after the substrate 2 is attached to the optical device. Verticle alignment of the fibre cores to the optical waveguides is achieved as a consequence of the original photolithography of the V-grooves which establishes the height of the fibre cores to be the same as that of the optical waveguides 12.

Figure 2:
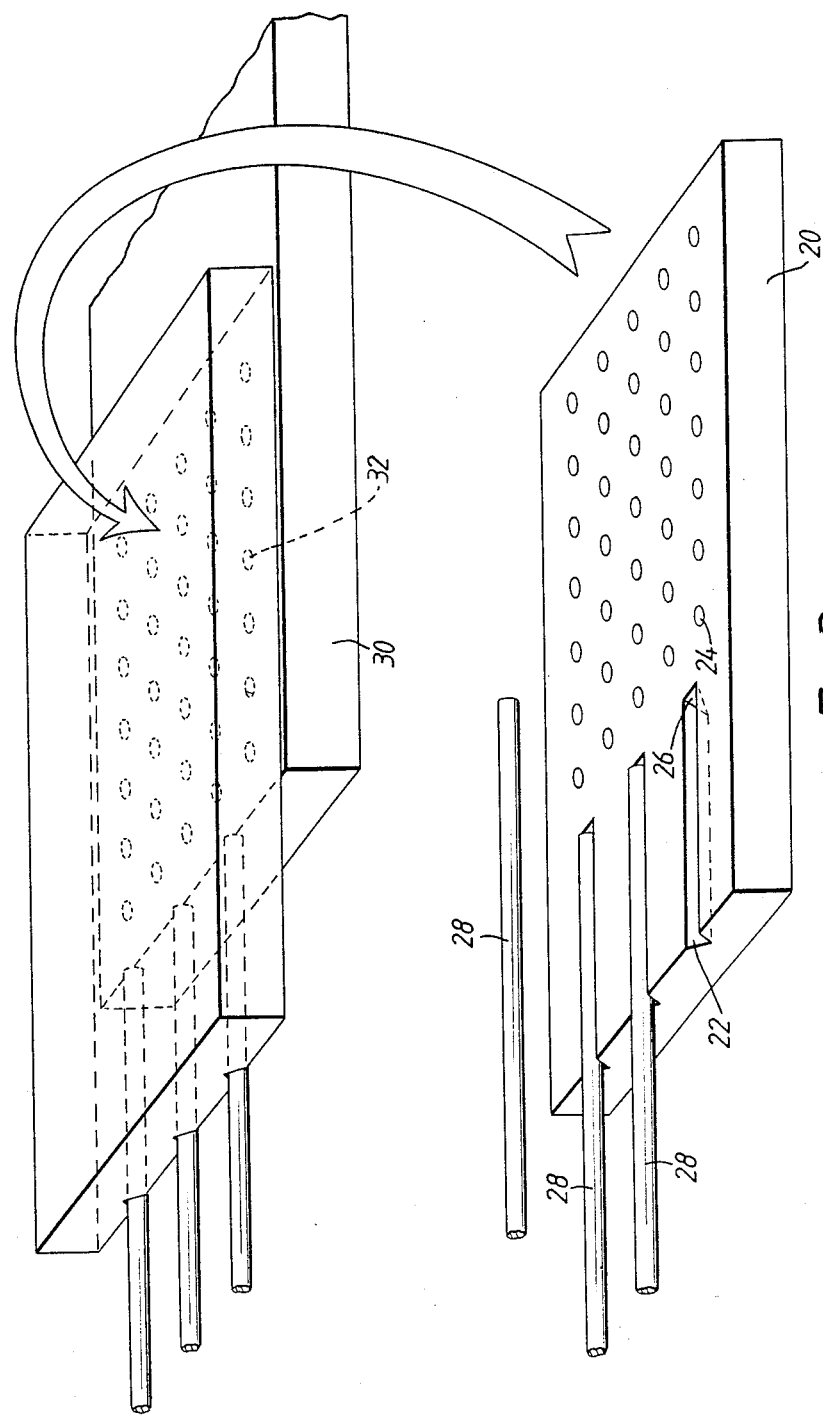
FIG. 2 is a view of a step in the assembly of the optical coupling of FIG. 1; and, FIG. 3 to 6 are perspective views of further optical couplings assembled in accordance with the invention.

Referring now to FIG. 2 a substrate of suitable material 20 has etched into its surface a series of V-grooves 22 and in precise alignment of these an array of solder wettable pads 24. The ends 26 of the V-grooves are also accurately fixed in the same photolithographic step and can be used as an end stop for the fibres 28 in order to set the final spacing of fibres to the optical device. The optical device 30 has a corresponding array of solder wettable pads 32. Solder can be evaporated or sputtered to either the V-groove substrate 20 or the optical device or both. The fibres may be fixed in the V-groove up to the end stop prior to attachment to the optical device or this can be done after the two are joined. On inverting the substrate 20 as shown and reflowing the solder a final fibred assembly is produced.

Figure 3:
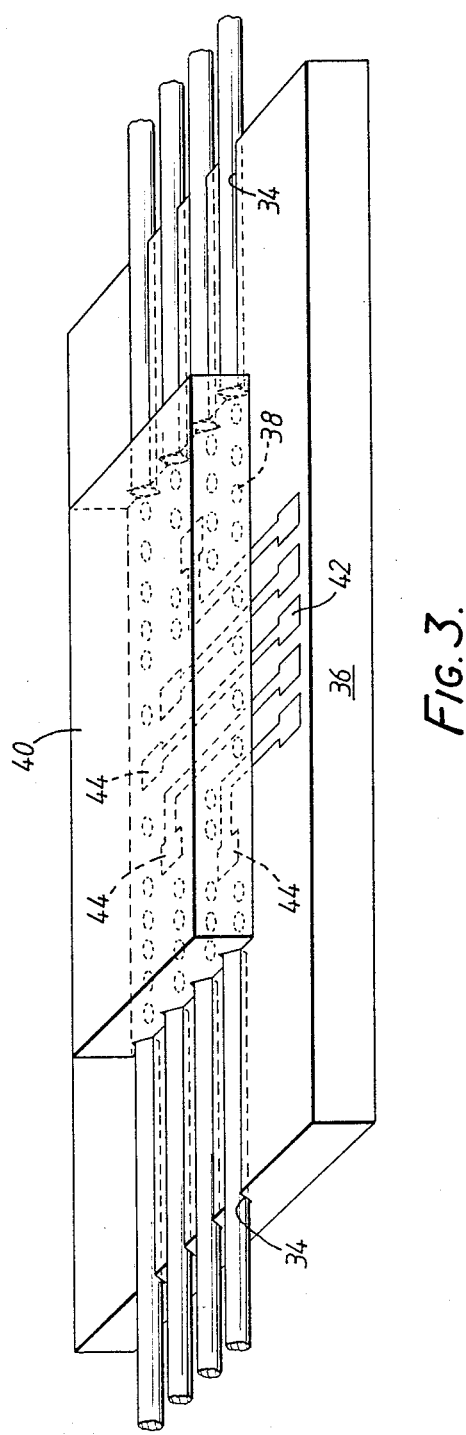

Referring to FIG. 3 two sets of V-grooves 34, which may be continuous are etched into a suitable substrate 36. Solder wettable pads 38 are again accurately located on the substrate 36 and optical device 40 to provide the final alignment. Also included on the V-groove slab are conductive tracks 42 which have solder wettable areas 44 corresponding to the optical device electrode location. After reflowing the interconnecting solder and insertion of the fibres into the V-grooves the device electrodes can be accessed by wire bonding to the protruding conductive tracks 42. In addition electrical components may be performed in the substrate 36 by known integration techniques in electrical connection with tracks 42.

Figure 4:
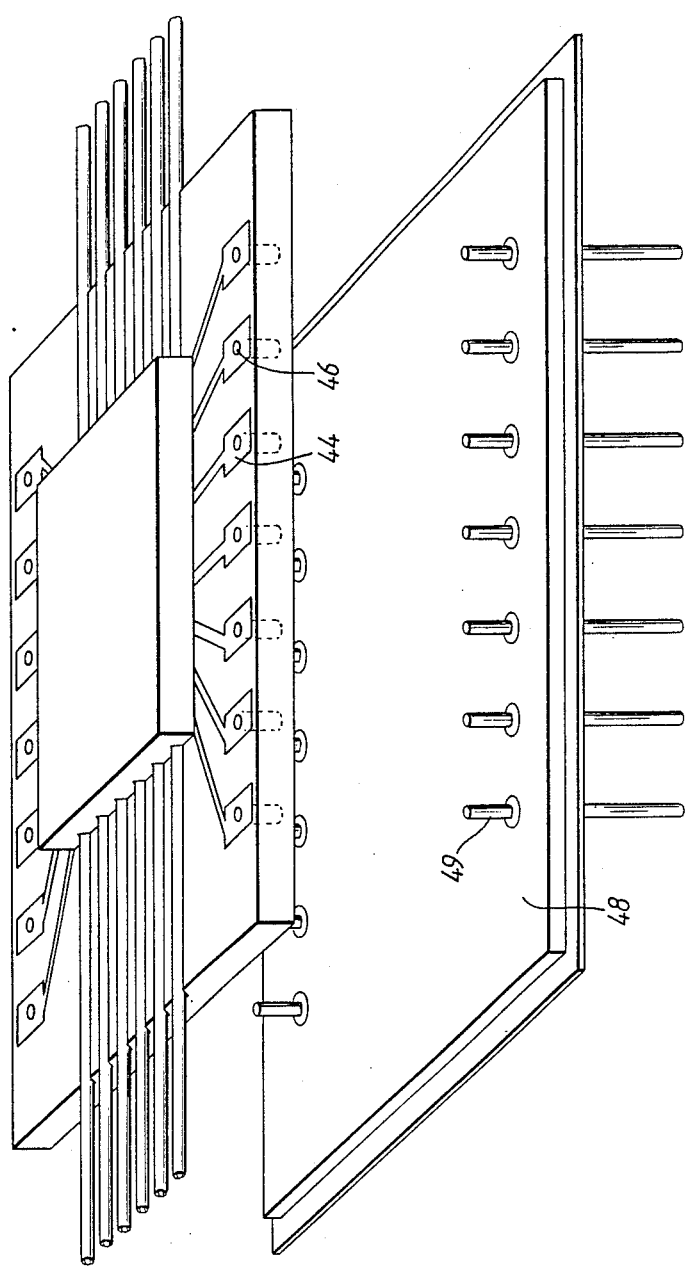

FIG. 4 shows a similar assembly to FIG. 3 including solder connected tracks 42 but in this instance the tracks terminate in plated through holes 46. The holes provide a positive location for the assembly onto a suitable package base 48 with protruding legs 49. Reflowing of solder applied to the holes gives electrical and mechanical connection without any further assembly required. The whole assembly may then be protected by encapsulation.

Figure 5:
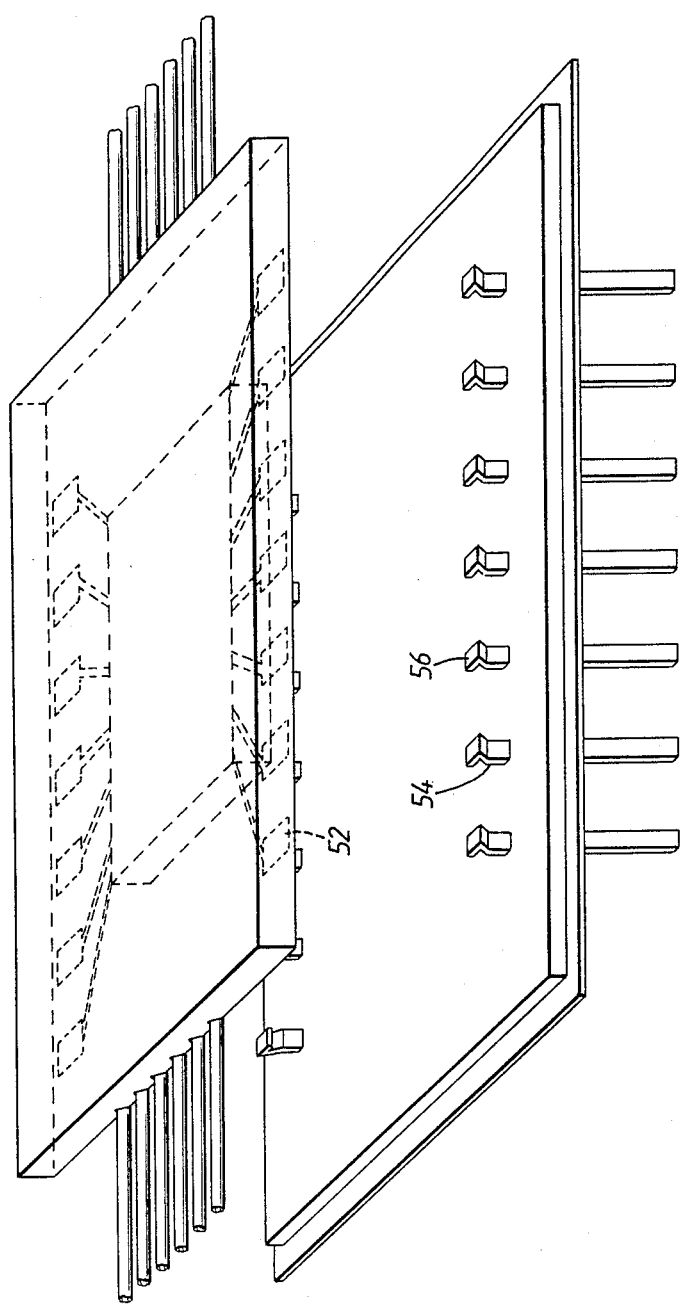

FIG. 5 which is a modification of the assembly of FIG. 4, shows a method of attaching the conductive tracks 52 to the package legs 54 without the necessity for plated through holes by providing flat end surfaces 56 for legs 54 registering with tracks 52. Solder or conductive adhesive is applied to the area of contact of end surfaces 56 and tracks 52 and the inverted assembly is bonded as shown. Plastic encapsulation may be used to protect the whole assembly.

Figure 6:
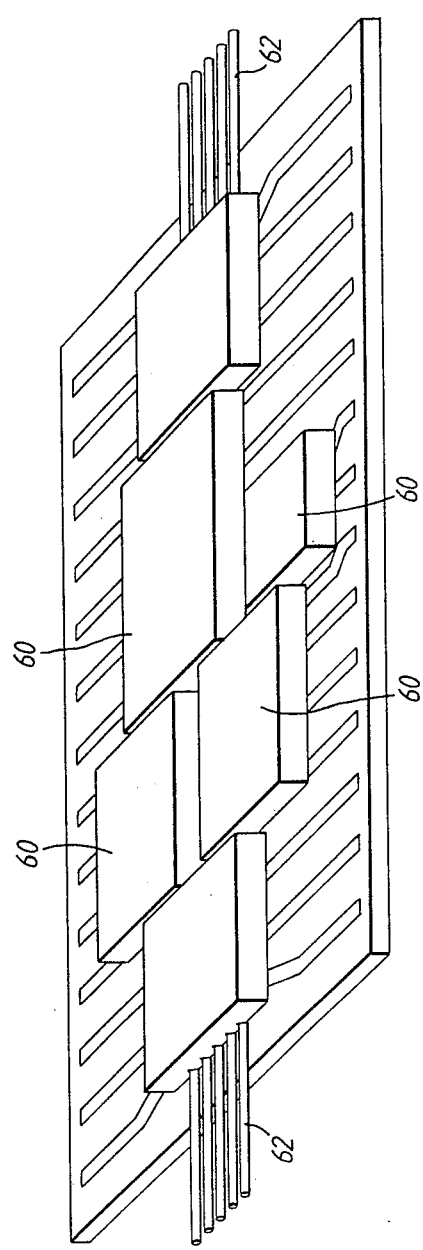

The assembly shown in FIG. 6 incorporates a number of optical devices 60 as well as fibre arrays 62. The optical devices 60 each is formed as a block and contains optical components aligned with one another and secured in position by the use of solder aligned pads. Such a system can be assembled in one operation and encapsulated in suitable material to protect it.

The foregoing description shows the invention to be an inexpensive and labour independent method of aligning optical devices and fibres to sub micron accuracy as well as providing for electrical connections to active devices without the use of wire bonding techniques. Standard photolithographic and solder reflow techniques are used and the final assembly can be encapsulated and packaged in conventioal configurations.

I claim:

1. A method for aligning an array of optical fibres with a corresponding array of optical components included as part of a block, the method comprising:

providing a substrate having a first major plane surface that is solder repellent and bears upon said first major plane surface a first array of solder wettable pads, each of said pads of said first array are a predetermined area, and in said substrate an array of grooves is defined, each of said grooves is aligned with, and is located in an accurate lateral relationship to, said array of solder wettable pads;

providing said corresponding optical component on said block, said block having a solder-repellent second major plane surface and has a second array of solder wettable pads, each of said pads of said second array are a predetermined area, and are located relative to each other at positions in one-to-one correspondence with corresponding positions of said solder wettable pads of said first array;

depositing on at least one of said solder pads of said first and said second arrays controlled amounts of solder;

mounting said block above said substrate with said first and second major plane faces facing;

reflowing said solder to form solder drops of predetermined dimensions, said solder drops securing said block at a predetermined height above said first major plane surface, and positioning said block both laterally and longitudinally in relation to said substrate; and locating each one of said optical fibres in a respective one of said grooves defined in said substrate to align said array of optical fibres and said array of optical components.

2. A method as claimed in claim 1 wherein the optical elements comprise optical fibres and the locating means comprise grooves of predetermined dimensions formed in the substrate.

3. A method as claimed in claim 2 wherein the optical fibres are secured in the grooves by adhesive means.

4. A method as claimed in claim 1 wherein the optical elements comprise optical components formed in one or more blocks, such optical components being secured and aligned to the substrate in similar manner to the first mentioned array of one or more optical components.

5. A method as claimed in claim 1 wherein the solder pads are formed by a photolithographic process.

6. A method as claimed in claim 1 wherein the controlled amounts of solder are evaporated onto the the substrate employing a mask formed by a photolithographic process.

7. A method as claimed in claim 1 wherein some or all of the solder pads formed on the substrate are formed as the ends of conductive tracks for interconnection to electrical components within said one or more blocks.

8. A method as claimed in claim 7 wherein the substrate is formed of semiconductor material which contains one or more integrated circuits electrically connected with said conductive tracks.

9. A method for aligning an optical fibre with a corresponding optical component that is included as part of a block, said method comprising:

providing a substrate having a first major plane surface that is solder repellent and bears upon said first major plane surface a first array of solder wettable pads, each of said pads of said first array are a predetermined area, and a groove is provided in said substrate, which groove is aligned with, and is located in an accurate lateral relationship to, said first array of solder wettable pads;

providing said block with said corresponding optical component, said block having a solder-repellent second major plane surface having a second array of solder wettable pads each of said pads of said second array are a predetermined area, and are located relative to each other at positions in one-to-one correspondence with corresponding positions of said solder wettable pads of said first array;

depositing controlled amounts of solderon at least one of said solder pads of said first and said second arrays;

mounting said block above said substrate with said first and second major plane faces each other;

reflowing said solder and thereby forming solder drops of predetermined dimensions, said solder drops securing a said block at a predetermined height above said first major plane surface, and positioning the block laterally and longitudinally in relation to said substrate; and locating said optical fibre in said groove defined in said substrate thereby to align said optical fibre and said optical component.

* * * * *